US012339330B2

(12) United States Patent
Gundlach et al.

(10) Patent No.: US 12,339,330 B2
(45) Date of Patent: Jun. 24, 2025

(54) THIN FILM MAGNETIC FIELD MAGNITUDE SENSOR

(71) Applicant: Government of the United States of America, as represented by the Secretary of Commerce, Gaithersburg, MD (US)

(72) Inventors: David James Gundlach, Montgomery Village, MD (US); Emily Geraldine Bittle, Bethesda, MD (US); Sebastian Engmann, Gaithersburg, MD (US)

(73) Assignee: Government of the United States of America, as represented by the Secretary of Commerce, La Jolla, CA (US)

( * ) Notice: Subject to any disclaimer, the term of this patent is extended or adjusted under 35 U.S.C. 154(b) by 134 days.

(21) Appl. No.: 18/116,217

(22) Filed: Mar. 1, 2023

(65) Prior Publication Data

US 2023/0280417 A1    Sep. 7, 2023

Related U.S. Application Data

(60) Provisional application No. 63/315,474, filed on Mar. 1, 2022.

(51) Int. Cl.
*G01R 33/032* (2006.01)
(52) U.S. Cl.
CPC .................. *G01R 33/032* (2013.01)
(58) Field of Classification Search
CPC ..................... G01R 33/032; Y02E 10/549
See application file for complete search history.

(56) References Cited

U.S. PATENT DOCUMENTS

| 2002/0027206 A1* | 3/2002 | Yuan | H01L 31/173 257/E31.109 |
|---|---|---|---|
| 2004/0178325 A1* | 9/2004 | Forrest | H10K 30/211 250/214 R |
| 2009/0129724 A1* | 5/2009 | Carter | H10K 59/13 313/504 |
| 2010/0148160 A1* | 6/2010 | Cao | H10K 59/874 257/40 |
| 2014/0367572 A1* | 12/2014 | So | H10K 85/311 257/40 |
| 2017/0030981 A1* | 2/2017 | Lynde | H10N 50/01 |

(Continued)

OTHER PUBLICATIONS

Bittle, E.G., et al., "Measuring the impact of spin-triplet exciton orientation on photocurrent in an organic transistor", Journal of Materials Chemistry C, 2021, p. 11809-11814, vol. 9.

(Continued)

*Primary Examiner* — Akm Zakaria
(74) *Attorney, Agent, or Firm* — Office of Chief Counsel for National Institute of Standards and Technology

(57) ABSTRACT

A novel magnetic field sensor (MFS) may be created with an organic light emitting diode (OLED) made from an organic semiconductor material and an organic photodetector (OPD) built directly on top (or below) of the OLED, wherein one layer is made from a magnetically isotropic material, and which material has a magneto-resistive or magneto-electroluminescent signal that varies with the magnitude of a magnetic field to allow for measuring only the magnitude of the external magnetic field without regard to magnetic field direction.

12 Claims, 2 Drawing Sheets

(56) References Cited

U.S. PATENT DOCUMENTS

| | | | |
|---|---|---|---|
| 2020/0403162 A1* | 12/2020 | Luo | H10K 85/636 |
| 2022/0085336 A1* | 3/2022 | Hyun | H10K 59/879 |
| 2023/0133787 A1* | 5/2023 | Jung | C09K 11/06 |
| | | | 257/40 |
| 2023/0154318 A1* | 5/2023 | Nguyen | G01R 33/032 |
| | | | 324/244.1 |

OTHER PUBLICATIONS

Engmann, S., et al., "The role of orientation in the MEL response of OLEDs", Journal of Materials Chemistry C, 2021, p. 10052-10064, vol. 9.

\* cited by examiner

THIN FILM MAGNETIC FIELD MAGNITUDE SENSOR

CROSS REFERENCE TO RELATED APPLICATIONS

This application claims the benefit of U.S. Provisional Patent Application Ser. No. 63/315,474 (filed Mar. 1, 2022), which is herein incorporated by reference in its entirety.

This invention was made with United States Government support from the National Institute of Standards and Technology (NIST), an agency of the United States Department of Commerce. The Government has certain rights in this invention.

This patent disclosure may contain material that is subject to copyright protection. The copyright owner has no objection to the facsimile reproduction by anyone of the patent document or the patent disclosure as it appears in the U.S. Patent and Trademark Office patent file or records, but otherwise reserves any and all copyright rights.

Brief Description

Disclosed is a novel, all organic magnetic field sensor comprising an organic light emitting diode (OLED) and an organic photodetector (OPD). The sensor function is believed to be driven by the large magneto-electroluminescence (MEL) of an OLED, but the function of the present invention is not limited to this belief. In certain embodiments, the OPD is based on a solution processed organic absorber layer. In other embodiments, similar structures may be fabricated using sequential sublimed or thermally evaporated thin films. In certain embodiments, the OLED and OPD of the invention are separated from each other by a thin dielectric spacer layer. In other embodiments, the dielectric spacer layer is not required.

BRIEF DESCRIPTION OF THE DRAWINGS

The following description cannot be considered limiting in any way. Various objectives, features, and advantages of the disclosed subject matter can be more fully appreciated with reference to the following detailed description of the disclosed subject matter when considered in connection with the following drawings, in which like reference numerals identify like elements.

DETAILED DESCRIPTION

A detailed description of one or more embodiments is presented herein by way of exemplification and not limitation.

It has been discovered that a novel magnetic field sensor (MFS) may be created with an organic light emitting diode (OLED) made from an organic semiconductor material and an organic photodetector (OPD) built directly on top (or below) of the OLED, wherein either the OLED or the OPD is made from an oriented molecular or polymer organic semiconductor material with strong magnetic anisotropy, and which material has a magneto-resistive or magneto-electroluminescent signal that varies with the directionality and magnitude of a magnetic field. When electricity is applied to the MFS, the OLED outputs light which is measured as current at the OPD. The current output of the OPD may then be measured to determine the magnetic field strength in reference to a calibration curve. Changes to the output current is used to detect the external magnetic field direction and magnitude. It is believed that the MFS uses the magnetic dependence of optical signals (luminescence) to measure a magnetic field by means of an OLED and OPD acting together, although the present invention is not limited to this proposed mechanism.

The MFS of this invention features a magnetically isotropic layer to allow for measuring only the magnitude of the external magnetic field without regard to magnetic field direction. This allows the MFS to detect field magnitude without regard to the orientation of the magnetic field, which can be useful if the MFS is mounted on a flexible surface where the orientation of the device may not be controlled and would cause uncertainty in measurements.

Figure 1:
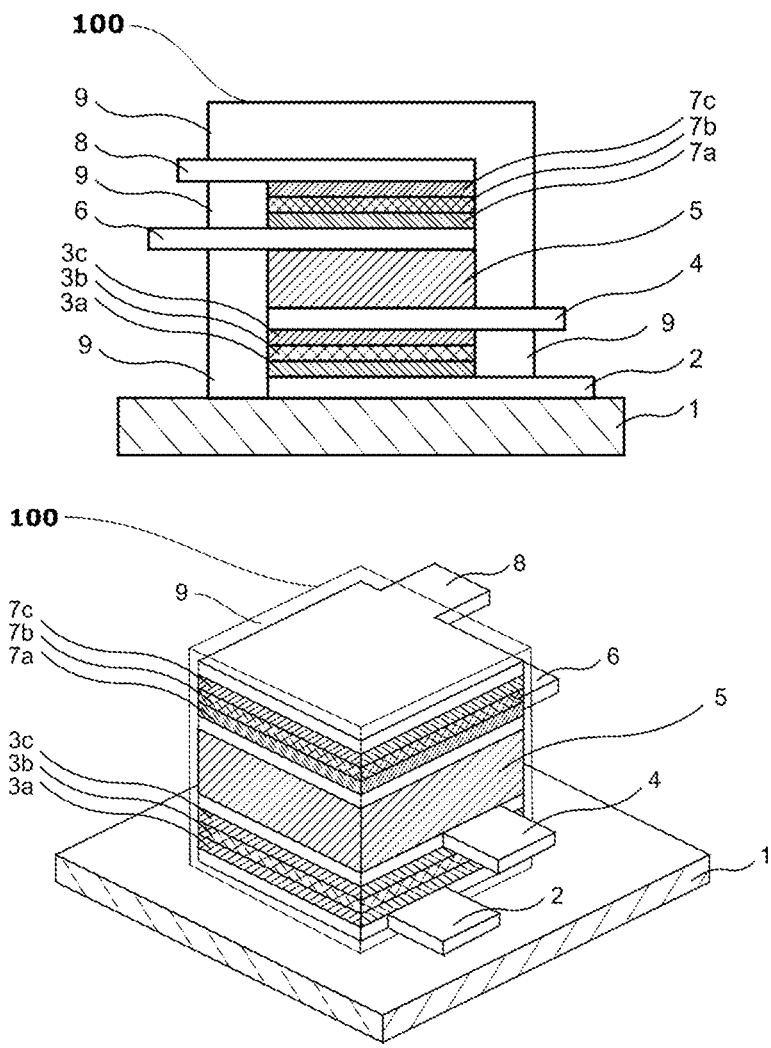
FIG. 1 shows a cross-sectional and perspective view of a magnetic field sensor, according to some embodiments.
Figure 2:
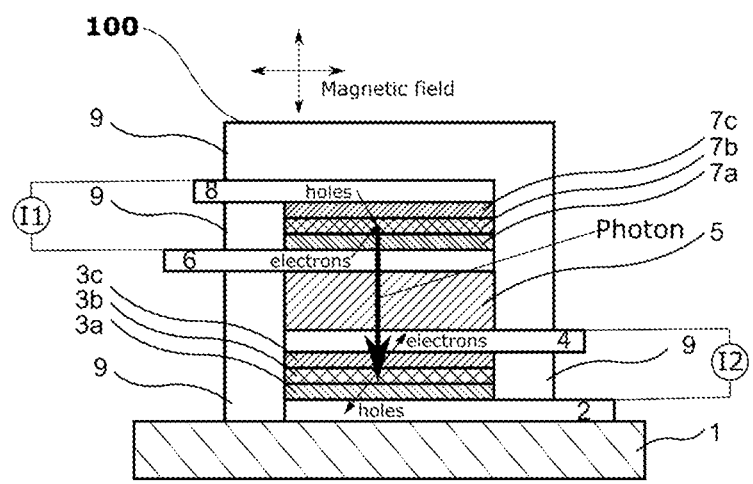
FIG. 2 shows a scheme for operation of a magnetic field sensor, according to some embodiments.

In an embodiment, with reference to FIG. 1 and FIG. 2, includes:

A magnetic field sensor (MFS) 100 is fabricated on top of a rigid or flexible substrate 1 to support the sensor. The main components of the sensor are the organic photodetector (OPD) 3 (comprising of subparts 3a-3c) and organic light emitting diode (OLED) 7 (comprising subparts 7a-7c) layer stacks. OPD 3 further comprises a hole extraction/electron blocking layer 3a and an electron extraction/hole blocking layer 3c sandwiching the active layer, OPD absorber 3b. OLED 7 further comprises a hole injection/electron blocking layer 7c and an electron injecting/hole blocking layer 7a sandwiching the active layer, OLED emitter 7b. The depicted order of 3a-3c and 7a-7c can be inverted depending on the architecture of the OLED/OPD and processing requirements. Individually, the hole or electron injection and electron blocking layer can be compromised of one or several layers, and this is also the case for the electron injection and hole blocking layer.

Layers compromising the OPD stack 3 and OLED stack 7 can be processed via various methods, including but not limited to: physical vapor deposition (PVD); chemical vapor deposition (CVD); and solution deposition techniques (spin-coating, slot-die-coating, spray-coating, etc). The process of injecting charge carriers to the OLED is accomplished through a back contact 8 and an optically semitransparent or transparent front contact 6 electrically coupled to the OLED layer stack 7.

The process of extracting charge carriers/current due to light detected in the OPD 3 is accomplished through a front contact 2 and optically semi-transparent or transparent back contact 4 electrically coupled to the OPD layer stack 3.

The OLED and OPD layer stacks are separated by an optional, optically transparent spacer layer 5 which modulates the electrical coupling between the OLED stack 7 and OPD stack 3, and which also acts as an optical spacer layer that allows for optimization of light outcoupling of the OLED stack 7 into the OPD stack 3 via optical interference. Optically transparent spacer layer 5 may not be required in optimized sensor structures.

The MFS 100 is optionally encapsulated by an insulating layer 9 that protects the sensor from mechanical and environmental influences. The encapsulation can be either rigid or flexible and might incorporate stabilizing compounds such as radical scavengers, getter materials, or antioxidants that aim to increase the sensor's lifetime by preventing chemical degradation of organic compounds that compromise the MFS 100 due to environmental influences.

In one embodiment, the MFS 100 is operated in the following manner, following FIG. 2. Current I1 is applied at contacts 6 and 8 to inject electrons and holes which produce photons in OLED 7 (comprising subparts 7a-7c). The number of photons produced, and therefore the light generated by the OLED 7, is modulated by the external magnetic field. The orientation of the sensor with respect to the direction of the external magnetic field does not impact the OLED output. Photons produced by the process described above are detected at OPD 3 (comprising subparts 3a-3c) following the photon path indicated by an arrow and labeled as "Photon," and the resulting hole and electron current I2 produced from absorbing the photon in OPD 3 is then extracted using contacts 2 and 4. The magnitude of the current output I2 from the OPD 3 is referenced to a calibration for the sensor which indicates the external magnetic field strength.

The Hall effect sensor is currently a commonly used MFS. Unlike the subject invention, the Hall effect sensor is constructed of rigid material which is not printable. The solubility of the materials used to make the MFS that is the subject of this invention allows this sensor to be printed as opposed to being produced through the standard lithography process.

Printed electronics can be integrated into a wider variety of substrates, such as plastics and paper, and allow for broader accessibility of repeatable circuit board manufacturing, allowing for smaller scale development for individual users and small businesses, similar to the opportunities presented by 3D printing. Printed electronics are projected to be used more widely in conjunction with technology associated with the Internet of Things.

The subject invention, however, promises to provide a solution to the current problem of integrating MFS technology into a larger variety of objects, such as fabrics and curved surfaces, which will require electronics that are flexible and capable of conforming to surfaces with various contours, as well as being printable.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix (s) as used herein is intended to include both the singular and the plural of the term that it modifies, thereby including at least one of that term (e.g., the colorant(s) includes at least one colorants). Option, optional, or optionally means that the subsequently described event or circumstance can or cannot occur, and that the description includes instances where the event occurs and instances where it does not. As used herein, combination is inclusive of blends, mixtures, alloys, reaction products, collection of elements, and the like.

As used herein, a combination thereof refers to a combination comprising at least one of the named constituents, components, compounds, or elements, optionally together with one or more of the same class of constituents, components, compounds, or elements.

All references are incorporated herein by reference.

The use of the terms "a," "an," and "the" and similar referents in the context of describing the invention (especially in the context of the following claims) are to be construed to cover both the singular and the plural, unless otherwise indicated herein or clearly contradicted by context. It can further be noted that the terms first, second, primary, secondary, and the like herein do not denote any order, quantity, or importance, but rather are used to distinguish one element from another. It will also be understood that, although the terms first, second, etc. are, in some instances, used herein to describe various elements, these elements should not be limited by these terms. For example, a first current could be termed a second current, and, similarly, a second current could be termed a first current, without departing from the scope of the various described embodiments. The first current and the second current are both currents, but they are not the same condition unless explicitly stated as such.

The modifier about used in connection with a quantity is inclusive of the stated value and has the meaning dictated by the context (e.g., it includes the degree of error associated with measurement of the particular quantity). The conjunction or is used to link objects of a list or alternatives and is not disjunctive; rather the elements can be used separately or can be combined together under appropriate circumstances.

The invention claimed is:

1. A magnetic field sensor, the magnetic field sensor comprising:
   a substrate which supports the components of the magnetic field sensor;
   an organic photodetector; and
   an organic light emitting diode;
   wherein the organic photodetector and the organic light emitting diode are arranged in layers;
   wherein the organic light emitting diode is oriented to emit photons towards the organic photodetector;
   wherein the organic photodetector further comprises a hole extraction/electron blocking layer and an electron extraction/hole blocking layer;
   wherein the organic light emitting diode further comprises a hole injection/electron blocking layer and an electron injecting/hole blocking layer; and
   wherein at least one of the organic photodetector and the organic light emitting diode is magnetically isotropic.

2. The magnetic field sensor of claim 1, wherein the substrate is rigid.

3. The magnetic field sensor of claim 1, wherein the substrate is flexible.

4. The magnetic field sensor of claim 1, wherein the hole extraction/electron blocking layer, the electron extraction/hole blocking layer, the hole injection/electron blocking layer, and the electron injecting/hole blocking layer are all discrete, separate layers.

5. The magnetic field sensor of claim 1, wherein the hole injection/electron blocking layer or the electron injecting/hole blocking layer of the organic light emitting diode is the same layer as the hole extraction/electron blocking layer of the organic photodetector.

6. The magnetic field sensor of claim 1, wherein the hole injection/electron blocking layer or the electron injecting/hole blocking layer of the organic light emitting diode is the same layer as the electron extraction/hole blocking layer of the organic photodetector.

7. The magnetic field sensor of claim 1, further comprising:
   a back contact and an optically semitransparent or transparent front contact electrically coupled to the organic light emitting diode; and a front contact and an optically semi-transparent or transparent back contact electrically coupled to the organic photodetector.

8. The magnetic field sensor of claim 7, wherein the organic light emitting diode and the organic photodetector are separated by an optically transparent spacer layer.

9. The magnetic field sensor of claim 1, further comprising an insulating layer encompassing the organic light emitting diode and the organic photodetector.

10. The magnetic field sensor of claim 9, wherein the insulating layer further comprises radical scavengers, getter materials, or antioxidants.

11. A method for detecting magnitude of an external magnetic field, the method comprising:
    exposing a magnetic field sensor comprising an organic light emitting diode and an organic photodetector to an external magnetic field;
    applying current through a first set of electrical contacts to the organic light emitting diode, producing photons; and
    detecting the photons with the organic photodetector;
    wherein the organic photodetector and the organic light emitting diode are arranged in layers;
    wherein the organic light emitting diode is oriented to emit photons towards the organic photodetector;
    wherein the organic photodetector on detection of the photons produces a current which is extracted through a second set of electrical contacts;
    wherein number of photons produced by the organic light emitting diode is modulated by a magnitude of the external magnetic field; and
    wherein magnitude of the current output from the second set of electrical contacts is reflective of the magnitude of the external magnetic field.

12. The method of claim 11, wherein the magnetic field sensor has been calibrated such that, for a known current input to the first set of electrical contacts, the current output from the second set of electrical contacts allows a measurement of the magnitude of the external magnetic field.

* * * * *